United States Patent [19]
Scott et al.

[11] Patent Number: 5,019,888
[45] Date of Patent: May 28, 1991

[54] CIRCUIT TO IMPROVE ELECTROSTATIC DISCHARGE PROTECTION

[75] Inventors: David B. Scott, Plano; Patrick W. Bosshart; James D. Gallia, both of Dallas, all of Tex.

[73] Assignee: Texas Instruments Incorporated, Dallas, Tex.

[21] Appl. No.: 76,622

[22] Filed: Jul. 23, 1987

[51] Int. Cl.⁵ .............................................. H01L 27/02
[52] U.S. Cl. ...................................... 357/41; 357/51; 357/23.13; 357/23.8; 357/43; 361/212
[58] Field of Search ...................... 357/51, 23.13, 12.1, 357/45, 34, 41, 43, 23.8, 67 S; 307/348

[56] References Cited

U.S. PATENT DOCUMENTS

| | | | |
|---|---|---|---|
| 4,342,045 | 7/1982 | Kim | 357/51 |
| 4,641,173 | 2/1987 | Malhi et al. | 357/51 |
| 4,654,865 | 3/1987 | Sunazuka et al. | 357/51 |
| 4,656,491 | 4/1987 | Igarashi | 357/41 |
| 4,675,715 | 6/1987 | Lepselter et al. | 357/67 R |
| 4,686,551 | 8/1987 | Mihara | 357/23.13 |
| 4,689,655 | 8/1987 | Sonnenberger | 357/51 |

OTHER PUBLICATIONS

Murarka, "Refractory Silicides for Integrated Circuits", *J. Vac. Sci. Technol.*, 17(4), Jul./Aug. 1980, pp. 776–792.

*Primary Examiner*—William Mintel
*Attorney, Agent, or Firm*—James C. Kesterson; James T. Comfort; Melvin Sharp

[57] ABSTRACT

An output buffer (26) comprises a plurality of transistors (28) arranged in parallel between an output pin (34) and ground (38). Resistors (30) are connected in series between the drain (30) of the transistors (28) and the output pin (34) to ensure that an electrostatic discharge generated through normal handling will be distributed substantially equally through each of the transistors (28), thus preventing damage to the output buffer (26).

16 Claims, 2 Drawing Sheets

CIRCUIT TO IMPROVE ELECTROSTATIC DISCHARGE PROTECTION

TECHNICAL FIELD OF THE INVENTION

This invention pertains in general to integrated circuits, and more particularly to a method and apparatus for protecting integrated circuits from electrostatic discharge.

BACKGROUND OF THE INVENTION

Integrated circuits used in military applications must meet MIL-STD 883B, which specifies the Human Body Model ESD (Electro-Static Discharge) test model to determine the amount of electrostatic discharge that an integrated circuit can absorb without damage. Since electrostatic discharge is imparted to the integrated circuits during normal handling of the chips, and to the boards containing the integrated circuits chips, it is desirable that the integrated circuits be able to absorb as much electrostatic discharge as possible.

The use of silicides in semiconductor manufacturing has increased the likelihood of a high electrostatic discharge resulting in voltage which causes damage to one of the output transistors connected to the input or output pins of an integrated circuit. The ESD problem is further aggravated by a move toward increasing current levels specified by the industry.

The ESD problem arises when one transistor attempts to sink all the current generated by an electrostatic discharge. Even with output buffers having several transistors, it is likely that one transistor will conduct before the others, and therefore will sink the majority of the current.

Therefore, a need has arisen in the industry for a circuit to protect the transistors connected to the input and output pins of an integrated circuit from electrostatic discharge.

SUMMARY OF THE INVENTION

The present invention describes a method and apparatus for discharging an electrostatic voltage present at the input and output package leads of an integrated circuit and which substantially eliminates problems associated with prior integrated circuits.

In one aspect of the invention, a plurality of transistors connected in parallel compose an input/output buffer, each transistor having an unshared series resistor connected to the transistor's source or drain. Therefore, a transient current caused by an electrostatic voltage at the input/output lead will not be absorbed by a single transistor, since the resistor associated with each of the transistors will prevent a high current from being conducted by a single transistor.

It is a technical advantage of the present invention that the resistors added to the transistors of the output buffer will increase the output conductance by only a negligible amount, due to the number of resistors in parallel. It is another advantage of the present invention that the additional circuitry does not affect the speed of other portions of the integrated circuit.

In a first embodiment of the present invention, an N tank, comprising a lightly doped N region may be used to provide the additional needed resistance. The N tank can be formed using present processes in the formation of the integrated circuit, thus not adding to the complexity of the fabrication.

In a second embodiment of the present invention, a titanium nitride layer is used to form the resistor. This embodiment has the advantage that it may be added without additional processing steps in circuits using titanium nitride interconnects. It is a further advantage of this embodiment that titanium nitride may exhibit increasing resistive characteristics in response to increasing current, thus actively directing a current surge to other transistors in the buffer.

In a third embodiment of the present invention, a buried N+ region is used to provide the needed resistance. It is an advantage of this embodiment that the buried N+ region can be provided on an interconnect mask without additional processing steps.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

The preferred embodiment of the present invention is best understood by referring to FIGS. 1-5 of the drawings, like numerals being used for like and corresponding parts of the various drawings.

Figure 1:
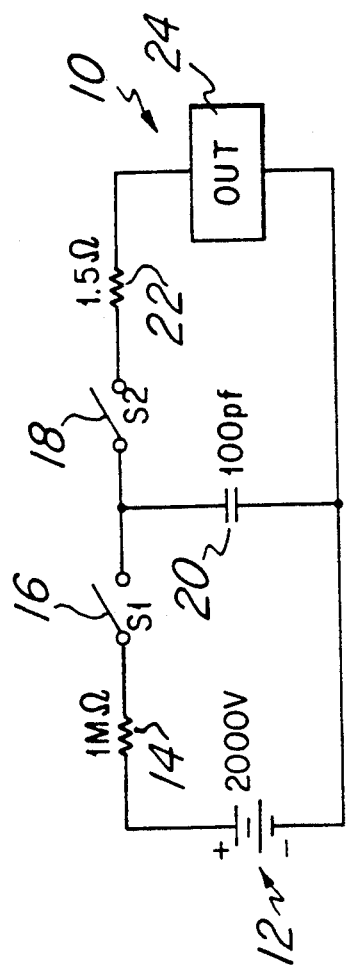
FIG. 1 illustrates the ESD test circuit mandated by MIL-STD 883B.

FIG. 1 illustrates the test circuit mandated by MIL-STD 883B. The test circuit 10 comprises a 2,000 volt voltage source 12, connected to 1 megaohm resistor 14. The other end of the 1 megaohm resistor 14 is connected to a first switch 16 which is operable to connect the resistor 14 to a second switch 18 and a 100 picofarad capacitor 20. The second switch 18 connects the first switch 16 and the 100 picofarad capacitor 20 to a 1.5 kilohm resistor 22. The 1.5 kilohm resistor 22 is connected to the device under test (DUT) 24. The DUT 24 and the second plate of the 100 picofarad capacitor 20 are connected to the 2,000 voltage source 12.

In operation, the first switch 16 is closed and the second switch 18 is opened to charge the capacitor 20 with the 2,000 volt charge. The 1 megaohm resistor 14 prevents operator injury by a potential high current in conjunction with the 2,000 volt source. After the capacitor 20 is charged, the first switch is opened and the second switch is closed, resulting in the voltage stored in the capacitor 20 being discharged to the DUT 24.

The purpose of the test circuit 10 is to simulate a electrostatic discharge to a device under test 24, such as an integrated circuit. Such electrostatic discharges may occur during normal handling procedures, and may be undetectable by the person handling the integrated circuits. Therefore, to ensure the reliability of the integrated circuits, the minimum standard of a 2,000 volt discharge must be met. Since discharges in excess of 8,000 volts may occur during normal handling procedures, it may be advisable to provide ESD protection in excess of the military standard.

Figure 2:
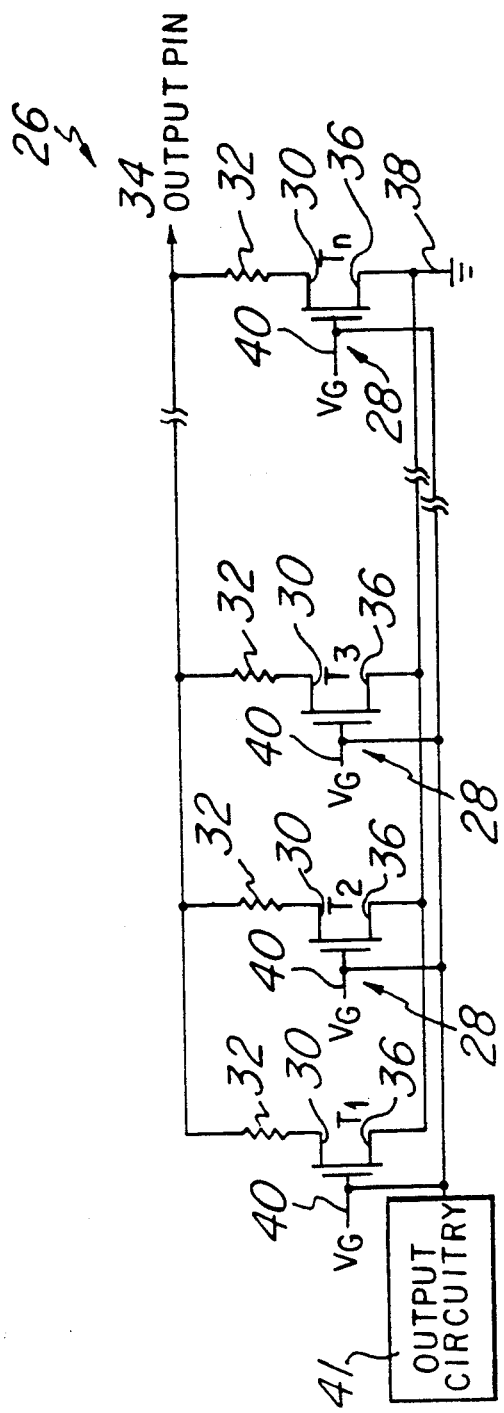
FIG. 2 illustrates a circuit diagram of the output buffer of the present invention.

FIG. 2 illustrates a circuit diagram of an output buffer having ESD protection as provided by the present invention. The output buffer 26 comprises a plurality of transistors, generally referred to as transistors 28. The drain 30 of each transistor 28 is connected to one end of a resistor 32. The other ends of the resistors are connected to an output pin 34 on the integrated circuit. The sources 36 of the transistors 28 are connected to a low voltage node, shown as ground 38. The gates 40 of the transistors are connected to output circuitry 41 which drives the gate voltage high or low depending upon the desired output.

In the event of an electrostatic voltage occurring at the output pin 34, the transient voltage would be discharged through the transistors 28 to ground 38. This discharge would occur whether the gate voltage was high or low, since the transistors 28 will enter a bipolar flyback mode when 10-16 volts is present between the source 36 and drain 30 of each transistor. However, some transistors may turn on more quickly than others, due to slight differences in the voltage thresholds in the individual transistors. Thus, if one transistor turns on earlier than the others, it would conduct the majority of the current in discharging the voltage at the output pin 34, were it not for the associated resistor 32. If a single transistor were to sink a large proportion of the current during discharge of the electrostatic voltage, it would be likely that that transistor would be rendered inoperative after a short period of time.

In the circuit of FIG. 2, the resistance associated with each transistor 28 will force the transient current to be shared by all of the devices, since the amount of current which a single transistor 28 may conduct is limited by the resistor 32. The amount of resistance provided by each resistor 32 will depend upon the number of transistors 28 used in the output buffer 26 and the allowable total output resistance acceptable. The number of transistors 29 which may be used is dependant upon the space available. The output resistance should generally not be much greater than 5 ohms.

Assuming a resistive value of 100 ohms associated with each of the transistors 28, and an output buffer having 50 such resistors, the increase in output resistance would be increased by only two ohms. Hence, the additional resistors have only a minimal affect on the output resistance.

Figure 3:
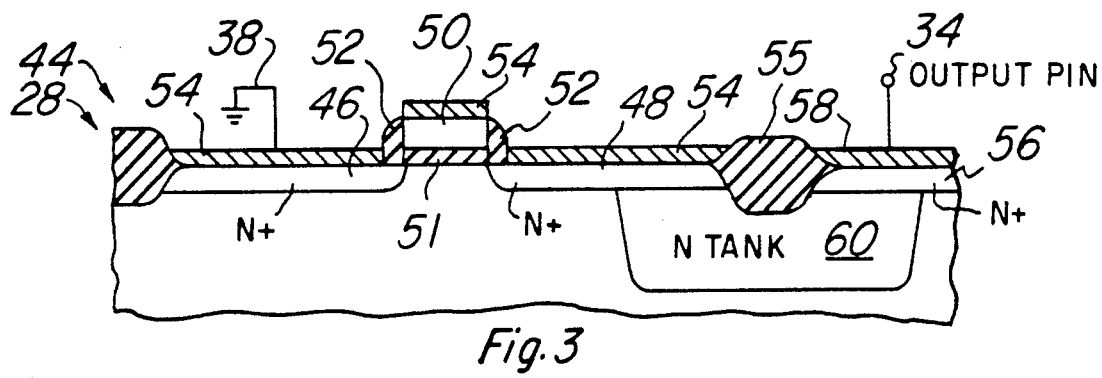
FIG. 3 illustrates a first embodiment of the present invention using an N tank as the resistive element.
Figure 4:
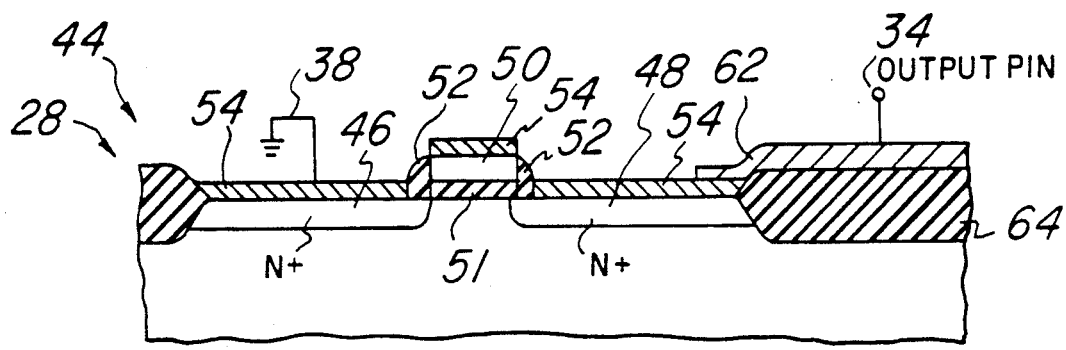
FIG. 4 illustrates a second embodiment of the present invention using a titanium nitride layer as the resistive element.
Figure 5:
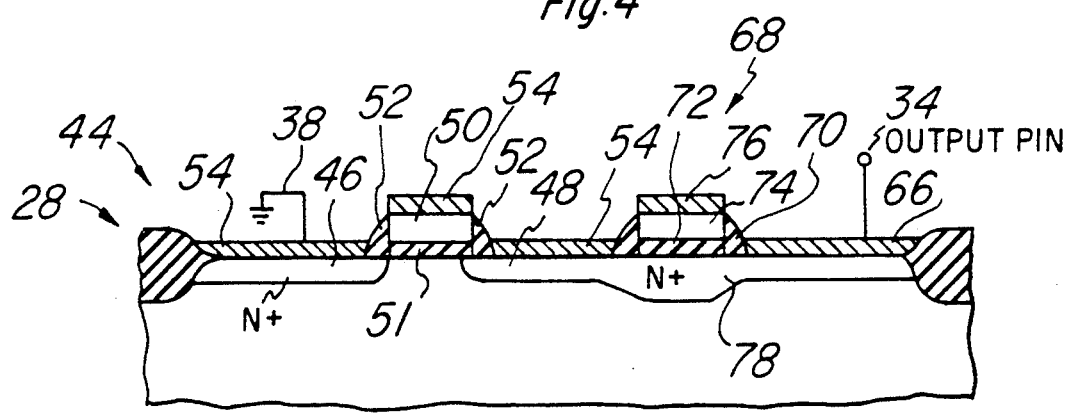
FIG. 5 illustrates a third embodiment of the present invention using a buried N+ region as the resistive element.

FIGS. 3-5 illustrate a number of processing techniques which may be used to provide the necessary resistance. FIG. 3 illustrates an embodiment using an N-channel transistor with an N tank region to provide the series resistance between the drain and the output pin 34. In this embodiment, the NMOS transistor 44 comprises N+ regions as the transistors source 46 and drain 48 regions. A gate oxide region 51 and a polysilicon layer 50 bridge over the source 46 and drain 48. Sidewall oxide layers 52 flank the gate region 50. Titanium disilicide (TiSi$_2$) layers 54 overlie the source 46, drain 48, and polysilicon layer 50.

A silicon dioxide (SiO$_2$) region 55 separates the drain 48 and its associated TiSi$_2$ layer 54 from a N+ interconnect 56 and an associated TiSi$_2$ layer 58. An N tank region 60 connects the drain 48 with the N+ interconnect 56. Ground 38 is connected to the TiSi$_2$ layer 54 above the source 46, and the output pin 34 is connected to the TiSi$_2$ layer 58 above the N+ interconnect 56.

In operation, the N tank region 60 acts as a resistor between the drain 48 and the N+ interconnect 56, and hence provides electrical connection with the output pin 34. For a tank having a 1,000 ohm/square resistance, a resistor region having a 20 micron×2 micron dimension yields a resistor of 10,000 ohms. By varying the doping in the N tank, the resistance per square may be varied as suitable.

The N tank is formed by implanting phosphorous in the desired regions using standard photolithographic techniques. The implant is typically diffused in a furnace at approximately 1100° C. for 24-36 hours. Since the N tank is also used to house the p-channel devices, the N tank 60 can be provided on a existing mask, so that the formation of the N tank resistor 60 will not add additional processing steps to the integrated circuits.

FIG. 4 illustrates an embodiment of the invention using titanium nitride as a resistive element for a N-channel transistor. In this embodiment, the N-channel transistor 44 has the same source region 46, drain region 48 and gate region 50, sidewall oxide layers 52, and TiSi$_2$ layers 54 as shown in connection with FIG. 3. A layer of titanium nitride 62 connects the TiSi$_2$ layer 54 above the drain 48 to the output pin 34. An isolation region 64 isolates the N-channel transistor 44 from other devices.

In operation, the titanium nitride layer 62 acts as a resistor between the drain 48 and the output pin 34. Using a 15 ohms/square titanium nitride layer, a resistor having dimensions of 3 microns×1 micron yields a 45 ohm resistor. This resistance could be increased by adjusting its dimensions to, for example, a 4 micron×1 micron device; however, 45 ohms has been found to provide sufficient ESD protection.

It is believed that titanium nitride exhibits resistive characteristics which increase as the current through the titanium nitride increases. This would provide the added advantage that the titanium nitride layer 62 actively passes a large current to the other transistor devices in the event of an electrostatic discharge.

This embodiment of the invention is particularly useful where titanium nitride layers are used as local interconnects.

FIG. 5 illustrates an N-channel transistor using a buried N+ region for a resistive element. As described in connection with FIG. 3, the N-channel transistor 44 comprises source region 46, a drain region 48, a gate region 50, sidewall oxide regions 52 and TiSi$_2$ layers 54. Ground 38 is connected to the TiSi$_2$ layer 54 formed above the source 46. The output pin 34 is connected to a TiSi$_2$ layer 66 separated from the TiSi$_2$ layer 54 above the drain 48 by an isolation region, indicated generally by reference number 68. In the illustrated embodiment, the isolation region 68 comprises a gate structure sidewall oxide regions 70, a polysilicon layer 74, a gate oxide layer 72 and a TiSi$_2$ layer 76. A buried N+ region 78 extends from the drain 48, underneath the isolation region 68, and below the TiSi$_2$ layer 66.

For N+ buried region 78 having a 30 ohm/square sheet resistance, a 3 micron×1 micron resistor yields 90 ohms of resistance. Although the isolation region 68 is shown as a gate structure, any suitable isolation regions can be used to prevent electrical conduction between the TiSi$_2$ layer 34 above the drain 48 and the TiSi$_2$ layer 66 connected to the output pin 34. However, if a gate structure is used for the isolation region 68, the TiSi$_2$ layer 76 should be connected to the TiSi$_2$ layer 66 to prevent a large voltage differential between the isolation region 68 and the N+ buried region 78, which could result in dielectric failure of the gate layer 72.

The buried N+ region 78 may be provided by an arsenic implant using photolithographic techniques. The implant is annealed at approximately 1000° C. for 40-50 minutes. Subsequently, an oxide layer is grown over the buried N+ region 78. The mask for the implant can be shared with an interconnect mask in which a N+ region is also used, thus the complexity of the design is not increased.

The three embodiments illustrated in FIGS. 3-5 illustrate different ways in which the resistance may be added to the transistors 28 of the output buffer 26. Although the resistance is shown connected to the drain of the transistor in each of the embodiments, the resistor could also be placed in series between the sources 36 of the transistors 28 and ground 38, and have the same effect of preventing excessive current from being conducted by a single transistor.

The output buffer 26 may also be used as part of an input buffer or an input/output buffer. When used as part of an input buffer, the gates of 40 of the transistors 28 are driven to turn the transistors off. A large voltage at the input or input/output lead will force the transistors 28 into the bipolar snapback mode, and the transistors 28 will conduct as described in connection with FIG. 2.

It should be noted that whereas the present invention has been illustrated in connection with N-channel devices, it could also be used to provide ESD protection in connection with other technologies such as bipolar and with other MOS transistors.

Although the present invention has been described in detail, it should be understood that various changes, substitutions and alterations can be made therein without departing from the spirit and scope of the invention as defined by the appended claims.

What is claimed is:

1. An output buffer for discharging both positive and negative electrostatic voltages created at the package leads of an integrated circuit comprising:
    a plurality of transistors connected in parallel and operable to conduct between the package leads in response to both a positive and negative electrostatic voltage at a package lead; and
    a plurality of resistive elements one each connected to one each of said transistors, such that current conducted by each of said transistors also flows through a respective resistor to a package lead, said resistors operable to limit the amount of either a positive or negative current though each of said transistors to a level at which said transistors are not damaged.

2. An output buffer for discharging electrostatic voltages created at the package leads of an integrated circuit comprising:
    a plurality of transistors connected in parallel and operable to conduct between the package leads in response to an electrostatic voltage at a package lead; and
    a respective resistive element connected to each of said transistors, such that current conducted by each of said transistors also flows through a respective resistor to a package lead, said resistors operable to limit the amount of current through each of said transistors to a level at which said transistors are not damaged;
    wherein each said resistive element comprises an N tank region having a first portion in ohmic contact with a transistor source/drain region and a second portion in ohmic contact with said package lead.

3. An output buffer for discharging electrostatic voltages created at the package leads of an integrated circuit comprising:
    a plurality of transistors connected in parallel and operable to conduct between the package leads in response to an electrostatic voltage at a package lead; and
    a respective resistive element connected to each of said transistors, such that current conducted by each of said transistors also flows through a respective resistor to a package lead, said resistors operable to limit the amount of current through each of said transistors to a level at which said transistors are not damaged;
    wherein each said resistive element comprises a titanium nitride region connected between a transistor source/drain region and said package lead.

4. An output buffer for discharging electrostatic voltages created at the package leads of an integrated circuit comprising:
    a plurality of transistors connected in parallel and operable to conduct between the package leads in response to an electrostatic voltage at a package lead; and
    a respective resistive element connected to each of said transistors, such that current conducted by each of said transistors also flows through a respective resistor to a package lead, said resistors operable to limit the amount of current through each of said transistors to a level at which said transistors are not damaged;
    wherein each said transistor is a field effect transistor and each said resistive element comprises an N+ doped region in electrical contact with the transistor channel region and said package lead.

5. The buffer of claim 1, 2, 3, or 4, wherein said plurality of transistors comprises at least six transistors.

6. The buffer of claim 1, 2, 3, or 4, wherein said resistive elements have a resistive value of at least 40 ohms.

7. The buffer of claim 1, 2, 3, or 4, wherein said effective output resistance of the plurality of resistors in parallel is less than 5 ohms.

8. An input/output buffer for discharging electrostatic voltage applied to a package lead without damage to the buffer, comprising:
    a plurality of transistors connected in parallel between the lead and a low voltage node and operable to conduct current between the lead and said low voltage node, each transistor comprising:
        a semiconductor substrate having a surface of a first conductivity type;
        a gate electrode defining a channel region in said substrate beneath said gate electrode;
        two doped regions of a second conductivity type operable as source and drain regions; and
    a plurality of resistive elements each connected to a doped region of a transistor, each said element operable to limit current flow between doped regions of a transistor such that transistor damage will not occur when one of said transistors conducts current in response to an electrostatic voltage prior to the conduction of other of the transistors.

9. The buffer of claim 8 wherein each said resistive element comprises a doped region of said second conductivity type electrically connected between the package lead and one of said transistor doped regions.

10. The buffer of claim 9 wherein said doped region of said second conductivity type comprises a lightly doped N tank region.

11. The buffer of claim 9 wherein said doped region of said second conductivity type comprises a heavily doped N+ region.

12. The buffer of claim 9 wherein a titanium silicide layer overlies a transistor doped region, said buffer further comprising an insulative isolation region separating the silicide layer from at least a portion of a resistive element.

13. The buffer of claim 12 wherein said isolation region comprises a gate structure.

14. The buffer of claim 8 wherein said resistive elements comprise a layer of titanium nitride.

15. The input/output buffer of claim 14 wherein said layer of titanium nitride is operably conductive to the package lead.

16. The buffer of claim 1 wherein the package leads comprise an output lead and a ground lead, said resistors connected between a transistor source/drain region and the output lead.

* * * * *